US009867144B2

(12) United States Patent  (10) Patent No.: US 9,867,144 B2
Golan  (45) Date of Patent: Jan. 9, 2018

(54) CALIBRATING TRANSMIT ERROR VECTOR MAGNITUDE USING OVER-THE-AIR LOOPBACK

(71) Applicant: QUALCOMM Incorporated, San Diego, CA (US)

(72) Inventor: Ziv Golan, Rehovot (IL)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 15/422,333

(22) Filed: Feb. 1, 2017

(65) Prior Publication Data

US 2017/0223639 A1  Aug. 3, 2017

Related U.S. Application Data

(60) Provisional application No. 62/290,914, filed on Feb. 3, 2016.

(51) Int. Cl.
*H04B 7/00* (2006.01)
*H04W 52/24* (2009.01)
*H04W 52/52* (2009.01)
*H04B 1/00* (2006.01)
*H04B 17/13* (2015.01)
(Continued)

(52) U.S. Cl.
CPC ........ *H04W 52/248* (2013.01); *H04B 1/0064* (2013.01); *H04B 17/13* (2015.01); *H04B 17/14* (2015.01); *H04W 52/52* (2013.01); *H04B 2001/045* (2013.01)

(58) Field of Classification Search
USPC .............................................. 455/522, 69–70
See application file for complete search history.

(56) References Cited

U.S. PATENT DOCUMENTS 7,564,893 B2  7/2009 O'Neill et al.
8,699,972 B2  4/2014 Lee et al.
9,444,560 B1  9/2016 Goh
(Continued)

FOREIGN PATENT DOCUMENTS

WO  WO-2008007329 A2  1/2008

OTHER PUBLICATIONS

International Search Report and Written Opinion—PCT/US2017/016238—ISA/EPO—Mar. 31, 2017.

*Primary Examiner* — Fayyaz Alam
(74) *Attorney, Agent, or Firm* — Patterson & Sheridan, L.L.P.

(57) ABSTRACT

Certain aspects relate to methods and apparatus for calibrating transmit error vector magnitude (EVM) using an over-the-air loopback mechanism. An apparatus includes a first radio frequency (RF) module configured to generate first RF signals based on first intermediate frequency (IF) signals and to output the first RF signals via at least a first antenna element, a second RF module configured to process the first RF signals, as obtained via a second antenna element, and to generate second IF signals, and a baseband module configured to determine a transmit performance metric for the first RF module based on the first IF signals and the second IF signals, determine a first transmit power level based on the determined transmit performance metric, and cause the first RF module to output second RF via the first antenna element at the first transmit power level.

14 Claims, 8 Drawing Sheets

(51) Int. Cl.
*H04B 17/14* (2015.01)
*H04B 1/04* (2006.01)

(56) References Cited

U.S. PATENT DOCUMENTS

| | | | |
|---|---|---|---|
| 9,509,355 B2 | 11/2016 | Kravitz et al. | |
| 2008/0159435 A1* | 7/2008 | Cohen | H03F 1/3247 375/297 |
| 2008/0242240 A1* | 10/2008 | Rofougaran | H04B 1/406 455/86 |
| 2010/0112962 A1* | 5/2010 | van Zeijl | H04B 1/0475 455/77 |
| 2011/0063169 A1 | 3/2011 | Chen et al. | |
| 2013/0122956 A1 | 5/2013 | Lee et al. | |
| 2014/0065968 A1* | 3/2014 | Rettig | H01Q 1/22 455/41.2 |
| 2015/0349838 A1 | 12/2015 | Petrovic et al. | |
| 2017/0078979 A1* | 3/2017 | Osterling | H04W 24/06 |

* cited by examiner

Example TxCompression EVM Calculation for QAM16

D = [-3-1i  -3+1i  -3-3i  -3+3i  -1-1i  -1+1i  -1-3i  -1+3i  1-1i
1+1i  1-3i  1+3i  3-1i  3+1i  3-3i  3+3i]/sqrt(5);

M = abs(mean(conj(S(:)).*R(:)))/abs(mean(S(:).*conj(S(:))));

R_avg = zeros(1,16);

for ii = 1:length(D)
    R_avg(ii) = mean(R(abs(S-D(ii))<1e-6));
End

TxCompression_EVM = 10*log10(mean(abs(R_avg(:)/M-D(:)).^2)./
mean(abs(D(:)).^2));

FIG. 7

CALIBRATING TRANSMIT ERROR VECTOR MAGNITUDE USING OVER-THE-AIR LOOPBACK

CLAIM OF PRIORITY UNDER 35 U.S.C. §119

The present application for patent claims benefit of U.S. Provisional Patent Application Ser. No. 62/290,914, filed Feb. 3, 2016, assigned to the assignee hereof and hereby expressly incorporated by reference herein.

FIELD

The present disclosure relates generally to wireless communication, and more particularly, to methods and apparatus for calibrating transmit error vector magnitude (EVM) of a radio frequency (RF) module using over-the-air loopback techniques.

BACKGROUND

The 60 GHz band is an unlicensed band which features a large amount of bandwidth and a large worldwide overlap. The large bandwidth means that a very high volume of information can be transmitted wirelessly. As a result, multiple applications, that require transmission of a large amount of data, can be developed to allow wireless communication around the 60 GHz band. Examples for such applications include, but are not limited to, wireless high definition TV (HDTV), wireless docking stations, wireless Gigabit Ethernet, and many others.

In order to facilitate such applications there is a need to develop integrated circuits (ICs), such as amplifiers, mixers, radio frequency (RF) analog circuits, and active antennas that operate in the 60 GHz frequency range. An RF system typically comprises active and passive modules. The active modules (e.g., a phase-array antenna) require control and power signals for their operation, which are not required by passive modules (e.g., filters). The various modules are fabricated and packaged as RFICs that can be assembled on a printed circuit board (PCB). The size of the RFIC package may range from several to a few hundred square millimeters.

In the market of consumer electronics, the design of electronic devices, and thus RF modules integrated therein, should meet the constraints of minimum cost, size, and weight. The design of the RF modules should also take into consideration the current assembly of electronic devices, and particularly handheld devices, such as laptop and tablet computers in order to enable efficient transmission and reception of millimeter wave signals.

SUMMARY

Certain aspects of the present disclosure provide an apparatus for wireless communications. The apparatus generally includes at least a first radio frequency (RF) module configured to generate first RF signals based on first intermediate frequency (IF) signals and to output the first RF signals for transmission via at least a first antenna element, at least a second RF module configured to process the first RF signals, as obtained via at least a second antenna element, and to generate second intermediate frequency (IF) signals, and a baseband module configured to determine a transmit error vector magnitude (EVM) metric for the first RF module based on the first IF signals and the second IF signals, to determine a first transmit power level based on the determined EVM metric, and to cause the first RF module to output second RF signals for transmission via at least the first antenna element at the first transmit power level.

Aspects also provide various apparatus, systems, computer program products, and processing systems for performing the operations described above.

DETAILED DESCRIPTION

Certain aspects of the present disclosure enable connectivity of one more RF modules to a baseband module using a flexible PCB. In some cases, transmission lines for direct current (DC) power and/or sensors may be included in the flexible PCB. In some cases, antennas may be incorporated in the flexible PCB.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of radio frequency (RF) communication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using hardware, software, or combinations thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, firmware, routines, subroutines, objects, executables, threads of execution, procedures, functions, etc., whether referred to as software/firmware, middleware, microcode, hardware description language, or otherwise.

Accordingly, in one or more exemplary embodiments, the functions described may be implemented in hardware, software, or combinations thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, PCM (phase change memory), flash memory, CD-ROM or other optical disk storage, magnetic disk storage or other magnetic storage devices, or any other medium that can be used to carry or store program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Figure 1:
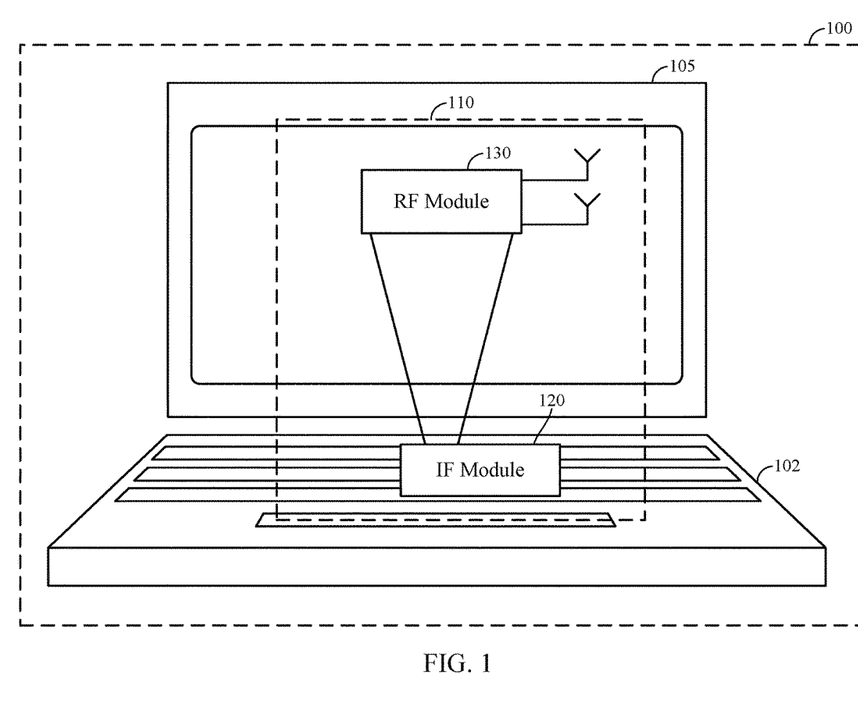
FIG. 1 illustrates an example laptop computer having radio transmission capabilities.

FIG. 1 illustrates an example laptop computer 100 that includes a radio frequency (RF) system 110 for transmission and reception of signals. The form factor of the RF system 110 is spread between the base plane 102 and lid plane 105 of the laptop computer 100.

The RF system 110 includes two parts: a baseband module 120 and RF module 130 respectively connected to the base plane 102 and lid plane 105. The RF module 130 includes active transmit (TX) and receive (RX) antennas. When transmitting signals, the baseband module 120 may provide the RF module 130 with control, local oscillator (LO), intermediate frequency (IF), and direct current (DC) power signals. The control signal may be utilized for functions, such as gain control, RX/TX switching, power level control, sensors, and detectors readouts. Specifically, beamforming based RF systems may require high frequency beam steering operations which are performed under the control of the baseband module 120. The control typically originates at the baseband module 120 of the system, and transfers between the baseband module 120 and RF module 130.

The RF module 130 typically performs up-conversion, using a mixer (not shown) on the IF signal(s) to RF signals and then transmits the RF signals through the TX antenna according to the control of the control signals. The power signals are direct current (DC) voltage signals that power the various components of the RF module 130.

In the receive direction, the RF module 130 receives RF signals at the frequency band of 60 GHz, through the active RX antenna and performs down-conversion, using a mixer, to IF signals using the LO signals, and sends the IF signals to baseband module 120. The operation of the RF module 130 is controlled by the control signal, but certain control information (e.g., feedback signal) is sent back to the baseband module 120.

Current solutions may require at least two cables (transmission lines) to transfer the IF, LO, power, and control signals between the baseband modules 120 and RF module 130.

This drawback may be more significant in millimeterwave RF systems, e.g., systems that operate in the 60 GHz frequency bands, as the RF module 130 are located close to the active antennas to perform the functions described above in order to minimize the power loss of the received and transmit signals. Thus, the baseband module 120 is located apart from the RF module 130. Further, because transferring high frequency signals over typical cables significantly attenuates the signals, cables that provide low attenuation characteristics are utilized. However, such cables are relativity expensive, thus increasing the bill of material (BoM) of consumer electronics devices.

It would be therefore advantageous to provide a solution for connecting, using a single transmission line, radio frequency modules in an electronic device for use in at least the 60 GHz frequency band.

Figure 2:
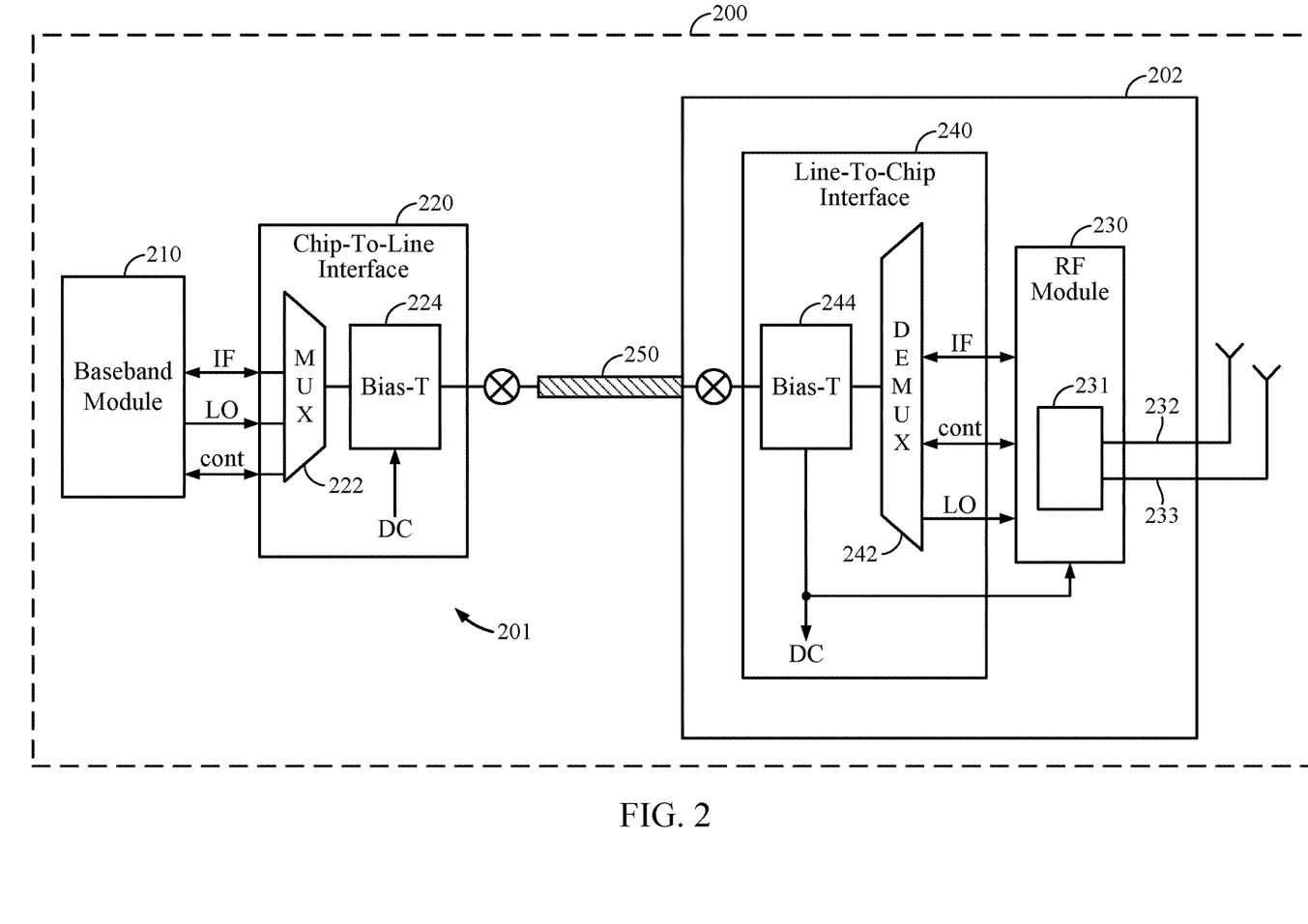
FIG. 2 illustrates an example RF system, in accordance with certain aspects of the present disclosure.

FIG. 2 illustrates an example RF system 200 utilized to describe various aspects of the present disclosure. The RF system 200 includes a baseband module 210 coupled to a chip-to-line interface module 220. In addition, the RF system 200 includes an RF module 230 coupled to a line-to-chip interface module 240. The RF module 230 comprises a RF circuitry 231 to perform up and down conversions of radio signals and to control the TX and RX active antennas 232 and 233. In an embodiment of the present disclosure, each of the antennas 232 and 233 is a phase array antenna. The RF system 200 enables the efficient transmission and reception of signals in at least the 60 GHz band.

The baseband module 210 and RF module 230 are apart from each other and are connected using a single transmission line 250 through the chip-to-line interface 220 and line-to-chip interface 240. In one embodiment, the baseband module 210 and RF module 230 are respectively located at the base plane and lid plane of a laptop computer. One of ordinary skill should appreciate that a connection between the base and lid planes is using, for example, a cable. Placing the baseband module 210 and RF module 230 apart from each other can help locate the active antennas 232 and 233 at such a location where optional reception/transmission of signals may be achieved. Such a location is typically not in proximity to the baseband module which is usually placed by the device's fan/ventilation. As another example, at a tablet computer, the baseband module 210 and RF module 230 are located at opposite ends of the tablet.

At least four different signals are simultaneously transferred over the transmission line 250 including, but not limited to, power, control, intermediate frequency (IF), and local oscillator source (LO). It should be noted that the IF and control signals are transferred over the transmission line 250 in both directions. The control signal controls, at least, the switching of the TX and RX active antennas 232 and 233, the direction of the antenna (beam forming), and gain control. The LO signals are used to synchronize the two modules and to perform up and down conversions of high frequency signals.

Each signal transferred over the transmission line 250 has a different frequency band. In an embodiment of the present disclosure, a frequency plan is disclosed that enables the efficient transfer of the five signals over the transmission line 250. In accordance with an embodiment of the present disclosure, the transmission line 250 is a standard micro coaxial cable. In this embodiment, the connection between the PCS and the micro coaxial cable is using a micro connector. According to another embodiment, the transmission line 250 can be formed by fabricating a metal line on a multilayer substructure.

During the simultaneous transfer of the LO, IF, control and power signals over the transmission line 250, the chip-to-line interface 220 and line-to-chip interface 240 are utilized. The chip-to-line interface 220 and line-to-chip interface 240 multiplex the various signals and impedance matches between the transmission line 250 and the PCBs to which the baseband module and RF module 230 are connected to.

As shown in FIG. 2, the chip-to-line interface 220 includes a multiplexer 222 and a Bias-T unit 224, and the line-to-chip interface 240 includes a demultiplexer 242 and a Bias-T unit 244. The multiplexer 222 multiplexes the IF signal, LO signal, and control signal to be output on a single output provided to the input of the Bias-T unit 224. The Bias-T unit 224 adds a DC voltage signal from a power source and outputs the signal to the transmission line 250. The multiplexer 222 also performs a demultiplexing operation to produce the IF signal(s) and control signal transferred from the RF module 230.

The demultiplexer 242 de-multiplexes the input received on the transmission line 250, to generate the control signal, IF signal, and LO signal. Prior to that, the Bias-T unit 244 extracts the DC voltage signal to power the RF module 230. It should be noted that the DC voltage signal is always provided to the RF module 230 to enable proper operation. The demultiplexer 242 also performs a multiplexing operation on the IF signal (results of a down conversion of the received RF signals) and control signal to be transferred to the baseband module 210.

In the embodiment illustrated in FIG. 2, the multiplexer 222 and Bias-T unit 224 are integrated in the baseband module 210 which are embedded in an RFIC. In the same fashion, the demultiplexer 242 and Bias-T unit 244 are integrated in the RF module 230, which is fabricated as an RFIC. In another embodiment, the multiplexer 222 and demultiplexer 242 are part of the baseband and RF modules respectively, thus are part of RFICs. The Bias-T units 224 and 244, on the other hand, are part of PCBs 201 and 202, thus the DC signal multiplexing/demultiplexing is performed over the PCBs 201 and 202.

In an embodiment of the present disclosure the source of the LO signal is at the RF module 230. Accordingly, the LO signal is multiplexed with the received IF signal (after down conversion) and transferred to the baseband module 210 over the transmission line 250.

In the embodiment shown in FIG. 2, the baseband module 210 and RF module 230 are fabricated on different substrates and connected using a transmission line (e.g., a cable). According to another embodiment of the present disclosure, the RF and baseband modules are fabricated on the same substrate and are connected using a coaxial cable. In this embodiment, the techniques disclosed herein for multiplexing the signals are also applied.

Figure 3:
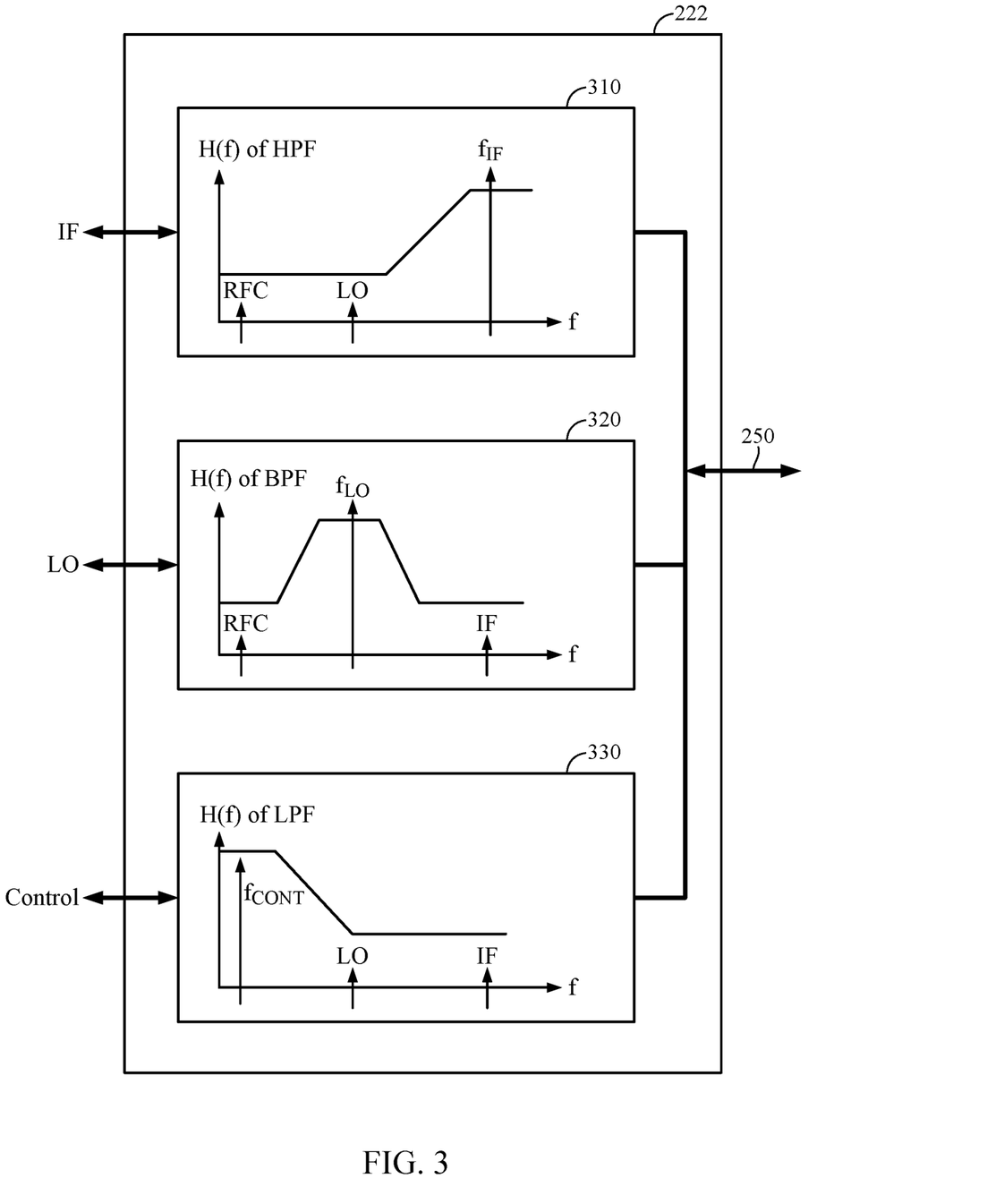
FIG. 3 illustrates an example multiplexer, in accordance with certain aspects of the present disclosure.

FIG. 3 shows a non-limiting block diagram of the multiplexer 222 constructed in accordance with an embodiment of the present disclosure. The multiplexer 222 separates the frequency spectrum to three different frequency bands: $f_{IF}$, $f_{LO}$, and $f_{CTRL}$ to multiplex the LO signal, IF signal, and control signal in these bands respectively. Specifically, the multiplexer 222 includes a high-pass filter (HPF) 310, a base-pass filter (BPF) 320, and a low-pass filter (LPF) 330; each passes signals in the $f_{IF}$, $f_{LO}$, and $f_{CTRL}$ frequency bands respectively.

Example Calibrating Transmit Error Vector Magnitude Using Over-the-Air Loopback

As described above, with reference to FIG. 2, in some implementations, a wireless device may utilize separate RF modules and separate baseband modules connected via one or more transmission lines 250. For example, a 60 GHz WiFi solution can consist of two separate chips and Single in-line packages (SiPs) for antenna arrays. The RF modules may be located near/with antennas (or antenna arrays), for example, at an optimal radiation point, while the baseband module may be located near an application processor.

RF devices may use high subcarrier modulations, such as quadrature amplitude modulation-16 (QAM16) and quadrature amplitude modulation-64 (QAM64), in order to transmit more data in the available bandwidth. When transmitting using such high subcarrier modulations, an RF device transmits data represented as a series of constellation points in the I-Q plane. Noise, distortion, and phase noise in the transmitter may all interfere with transmissions, resulting in transmitted constellation points deviating from their ideal locations.

Error vector magnitude (EVM) is a metric used to quantify the performance of a transmitter or receiver. An RF device may use information regarding EVM of a transmitter (e.g., transmit EVM) of the device in determining adjustments to make when transmitting to improve the quality of the transmitted signal, for example, by causing transmitted constellation points to be closer to their ideal positions in the I-Q plane. The RF device (e.g., the transmitter of the device) may then make the determined adjustments when transmitting. EVM is directly affected by a power amplifier (PA) linearity working point of a PA that may be included in a transmitter. There is therefore a benefit/advantage that may be realized by accurately calibrating PA linearity working points of RF devices.

Some prior art RF devices may determine EVM for a transmitter by using transmit power sensors. Transmit power sensors have limited accuracy, and thus do not allow RF devices to determine EVM with great accuracy.

Some prior art RF devices may determine EVM for a transmitter by using transmit/receive root-mean-square (Tx/Rx RMS) detectors. Tx/Rx RMS detectors have limited dynamic range, limited accuracy, and may need special calibrations to be performed during production of the RF device and/or when the RF device is activated. The limited dynamic range of a Tx/Rx RMS detector may cause the Tx/Rx RMS detector to be saturated when the RF device is transmitting, affecting the ability of the RF device to determine transmit EVM. The accuracy of Tx/Rx RMS detectors may also be affected by interfering signals (e.g., from other RF devices).

Aspects of the present disclosure provide techniques to calculate a new metric for an RF device, referred to as a transmit compression EVM, that is not dependent on transmit power sensors and uses a receiver of the RF device in an over-the-air loopback technique to measure signals transmitted by the RF device. Using a receiver of the RF device to measure signals transmitted by the RF device may give the RF device strong immunity to interfering signals when the RF device calculates the transmit compression EVM, because the close proximity of the receiving antenna to the transmitting antenna causes the transmitted signal to be received more strongly than an interfering signal that is not from the RF device. The receiver of the RF device may also have a larger dynamic range than traditional Tx/Rx RMS detectors.

Figure 4:
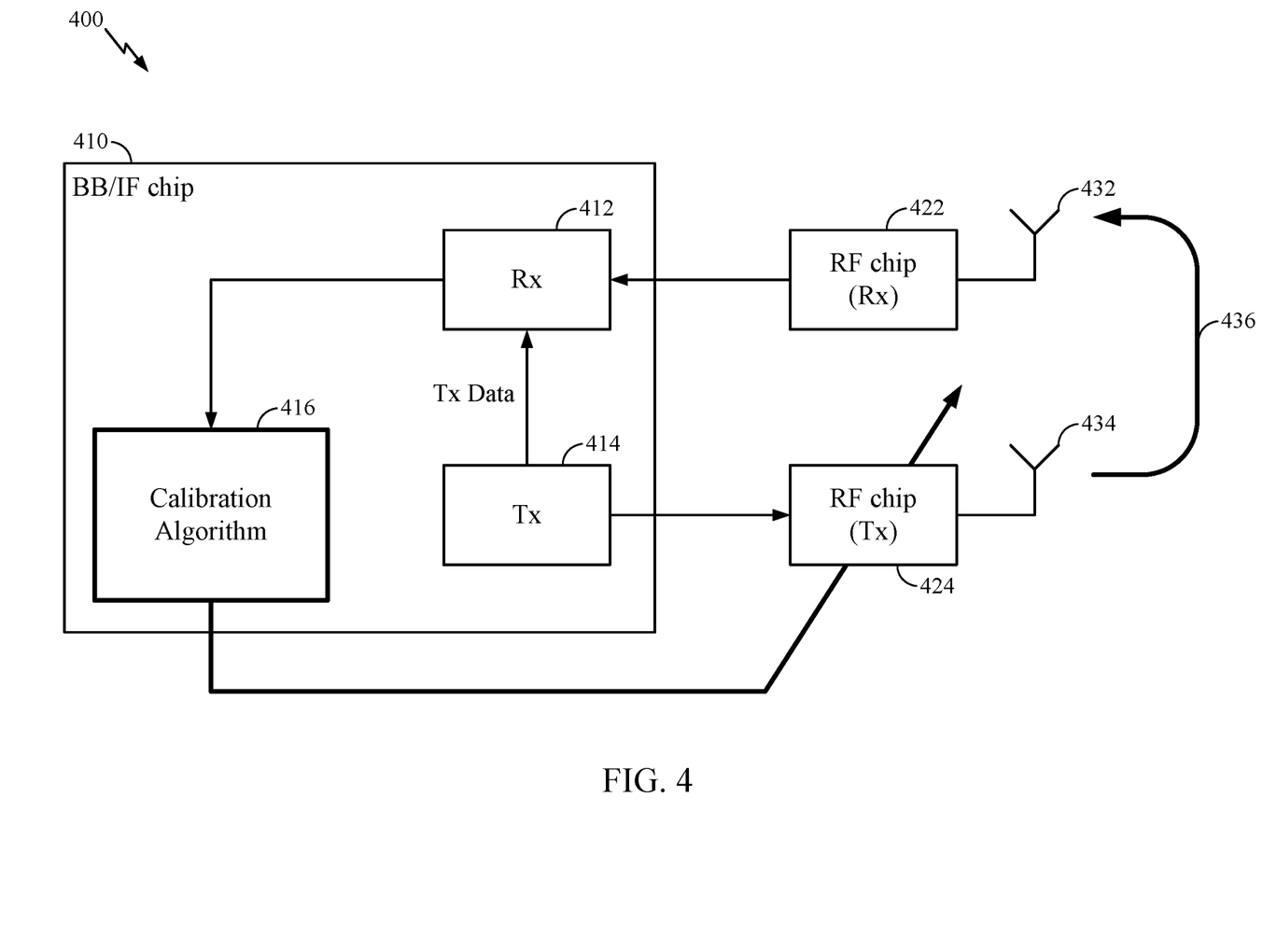
FIG. 4 illustrates a block diagram of an example RF system, in accordance with certain aspects of the present disclosure.

FIG. 4 illustrates a block diagram of an RF system 400 configured to calculate transmit compression EVM using over-the-air loopback techniques, in accordance with certain aspects of the present disclosure. The RF system 400 comprises a baseband module 410, sometimes referred to as a baseband/intermediate frequency (BB/IF) chip, at least two RF modules (e.g., chips) 422, 424, and at least two antenna elements 432 and 434.

The baseband module 410 includes a receive (Rx) portion 412, a transmit (Tx) portion 414, and a calibration algorithm portion 416. The transmit portion is configured to generate first intermediate frequency (IF) signals based on control signals obtained from, for example, a control processor (not shown) of a device including the RF system 400 or another portion of the baseband module 410. The Tx portion 414 of the baseband module 410 is also configured to output (e.g., via a wire or PCB trace) the first IF signals to a Tx portion of RF module 424 and to the Rx portion 412 of the baseband module 410.

The Tx portion of the RF module 424 is configured to generate first RF signals 436 based on the first IF signals (e.g., by upconverting the first IF signals) and to output the first RF signals 436 for transmission via at least a first antenna element 434. The Tx portion of the RF module 424 may output the first RF signals 436 via one or more antenna elements of an antenna array. The transmitted first RF signals 436 may be received via at least a second antenna element 432. The Tx portion of the RF module 424 is also configured to transmit according to a configuration and may obtain changes to the configuration from the calibration algorithm portion 416 of the baseband module 410. Additionally or alternatively, the Tx portion of the RF module 424 may obtain a new configuration from the calibration algorithm portion 416 of the baseband module 410 and then operate according to the new configuration.

The Rx portion of RF module 422 is configured to process (e.g., by downconverting) the first RF signals 436 obtained via at least the second antenna element 432 to generate second IF signals. The Rx portion of RF module 422 may obtain the first RF signals 436 via one or more antenna elements of an antenna array. The Rx portion of RF module 422 is also configured to output (e.g., via a wire or PCB trace) the second IF signals to the Rx portion 412 of the baseband module 410.

According to aspects of the present disclosure, the Rx portion of RF module 422 may be designed to have a high dynamic range in order to avoid being saturated when receiving the first RF signals 436. According to some aspects of the present disclosure, the Rx portion of RF module 422 may comprise a plurality of amplifier chains. The Rx portion of RF module 422 may be configured to select the lowest amplifier chain of the plurality of amplifier chains to obtain the first RF signals 436. In some aspects of the present disclosure, the Rx portion of RF module 422 may comprise a configurable attenuator at a low noise amplifier (LNA) input of the Rx portion of RF module 422, such that the Rx portion of RF module 422 can attenuate the first RF signals 436 before the first RF signals 436 are passed to the LNA, while the attenuator may be inactive if the Rx portion of RF module 422 is obtaining (e.g., receiving) signals from other RF devices. In other words, the RF module may obtain signals independent of (e.g., without using) the attenuator. According to some aspects of the present disclosure, the Rx portion of RF module 422 may be configured to process the first RF signals 436 without using an LNA (e.g., independently of the LNA, by bypassing the LNA), while continuing to amplify one or more other RF signals with the LNA when obtaining (e.g., receiving) signals from other RF devices.

The Rx portion 412 of the baseband module 410 is configured to obtain the second IF signals and determine a transmit performance metric, such as EVM, by comparing the second IF signals to the first IF signals obtained from the Tx portion 414 of the baseband module 410, as previously mentioned. The Rx portion 412 of the baseband module 410 is also configured to output the transmit performance metric to the calibration algorithm portion 416 of the baseband module 410.

The calibration algorithm portion 416 of the baseband module 410 is configured to obtain the transmit performance metric from the Rx portion 412 of the baseband module 410 and to determine a first transmit power level based on the determined transmit performance metric. The calibration algorithm portion 416 of the baseband module 410 is also configured to cause the Tx portion of the RF module 424 to generate second RF signals for transmission via at least the first antenna element 434 at the first transmit power level. The calibration algorithm portion 416 may change a configuration of the Tx portion of the RF module 424 as part of causing the Tx portion of the RF module 424 to generate the second RF signals for transmission via at least the first antenna element at the first transmit power level. Additionally or alternatively, the calibration algorithm portion 416 may determine a new configuration for the Tx portion of the RF module 424 as part of causing the Tx portion of the RF module 424 to generate the second RF signals for transmission via at least the first antenna element at the first transmit power level. Also additionally or alternatively, the calibration algorithm portion 416 may output the new configuration to the Tx portion of the RF module 424 as part of causing the Tx portion of the RF module 424 to generate the second RF signals for transmission via at least the first antenna element at the first transmit power level.

The calibration algorithm portion 416 of the baseband module 410 may store the first transmit power level in an entry corresponding to the first IF signals in a database of transmit power levels and IF signals. The baseband module 410 may be configured to generate second IF signals (e.g., based on control signals) and then retrieve the first transmit power level from the database, based on the second IF signals (e.g., if the second IF signals correspond to the first IF signals or are equivalent to the first IF signals). The baseband module 410 may further be configured to cause the first RF module to generate third RF signals, based on the second IF signals, for transmission via at least the first antenna element at the first transmit power. The transmit performance metric may be generated, also based on the third RF signals, as obtained signals generated at the second RF module (e.g., from IF signals generated based on the third RF signals).

The calibration algorithm portion 416 of the baseband module 410 may be configured to calibrate a power amplifier (not shown) of the Tx portion of the RF module 424 based on the transmit performance metric. Calibrating the power amplifier may include changing a configuration of the Tx portion of the RF module 424 or determining a new configuration of the Tx portion of the RF module 424 and outputting the new configuration to the Tx portion of the RF module 424.

Figure 5:
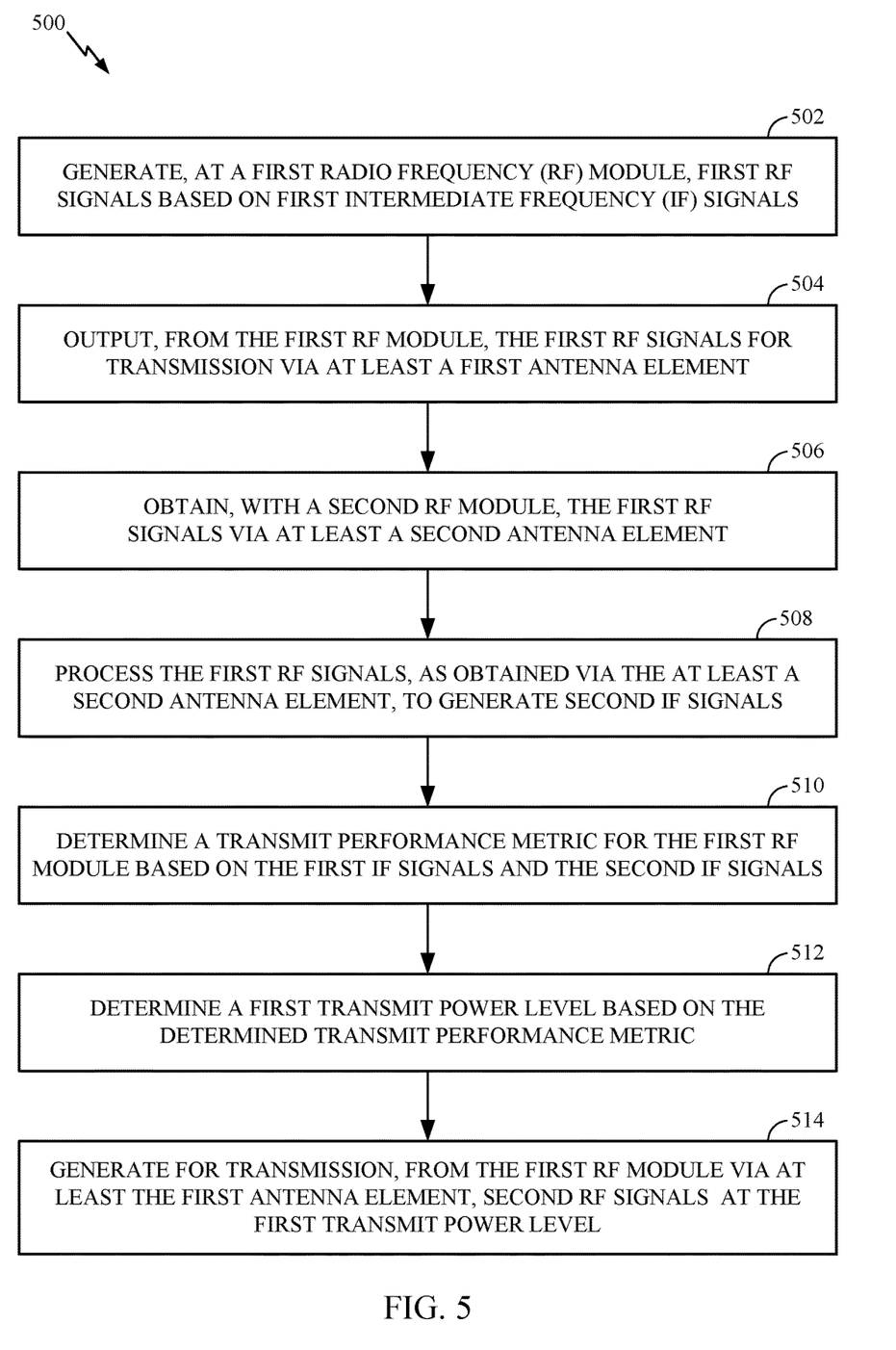
FIG. 5 illustrates an example operation that may be performed by an RF device, in accordance with certain aspects of the present disclosure.

FIG. 5 illustrates an example operation 500 for calibrating transmit EVM using over-the-air (OTA) loopback that may be performed by an RF device (e.g., laptop computer 100 shown in FIG. 1, RF system 200 shown in FIG. 2, RF system 400 shown in FIG. 4), in accordance with certain aspects of the present disclosure.

Operation 500 begins at block 502 by generating, at a first radio frequency (RF) module (e.g., RF module 424 shown in FIG. 4), first RF signals based on first intermediate frequency (IF) signals.

Operation 500 continues at block 504 by outputting, from the first RF module, the first RF signals for transmission via at least a first antenna element (e.g., antenna element 434 shown in FIG. 4).

At block 506, operation 500 continues by obtaining, at a second RF module (e.g., RF module 422 shown in FIG. 4), the first RF signals via at least a second antenna element (e.g., antenna element 432 shown in FIG. 4).

Operation 500 continues at block 508 by processing the first RF signals, as obtained via the at least a second antenna element, to generate second IF signals.

At block 510, operation 500 continues by determining a transmit performance metric for the first RF module based on the first IF signals and the second IF signals.

Operation 500 continues at block 512 by determining a first transmit power level based on the determined transmit performance metric.

At block 514, operation 500 continues by generating for transmission, from the first RF module via at least the first antenna element, second RF signals at the first transmit power level.

According to aspects of the present disclosure, an RF device may perform operation 500 repeatedly. The RF device may iterate operation 500 using a first RF module to output the first RF signals and one or more RF modules to obtain the RF signals to determine a Tx compression EVM metric for the first RF module.

Figure 6:
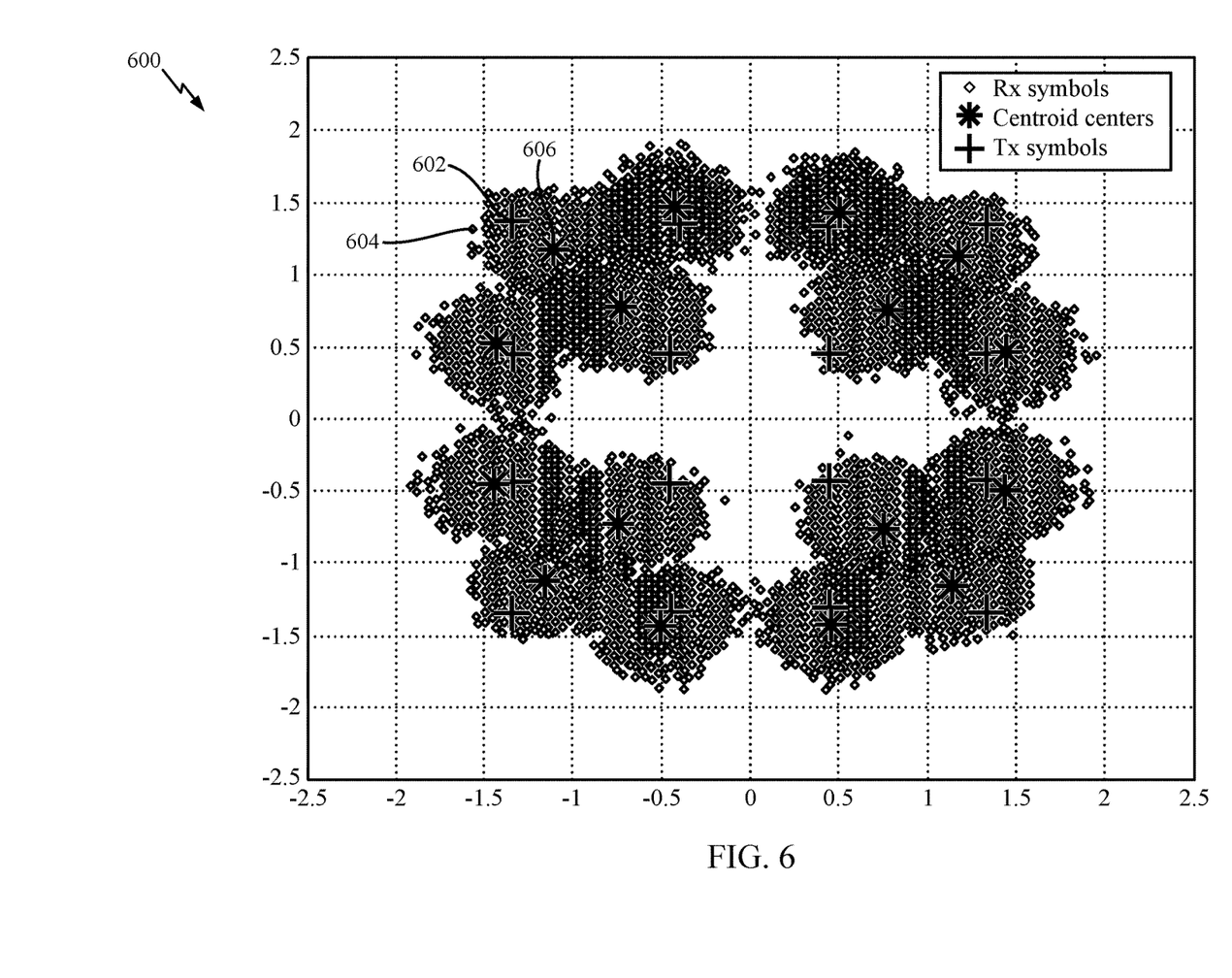
FIG. 6 illustrates an exemplary scatter plot of a transmitter transmitting using QAM16, in accordance with certain aspects of the present disclosure.

FIG. 6 illustrates an exemplary scatter plot 600 for calculating Tx compression EVM of a transmitter (e.g., the Tx portion of RF module 424) when the transmitter is transmitting using Quadrature amplitude modulation (e.g., QAM16), according to aspects of the present disclosure. The ideal locations for each of the sixteen symbols in the constellation are marked with crosses. For clarity, only one cross is labeled 602. The locations of a plurality of symbols as they were actually received (received symbols) are marked with small dots. For clarity, only one of the locations of the received symbols is labeled 604. For each symbol in the constellation, a centroid of a plurality of the received symbols is marked with a larger dot. For clarity, only one of the centroids is labeled 606. By determining a vector distance between a centroid 606 and the corresponding ideal location 602 for each symbol, an RF device (e.g., a baseband module) may calculate a Tx EVM metric for a transmitter, as described in more detail above.

Figure 7:
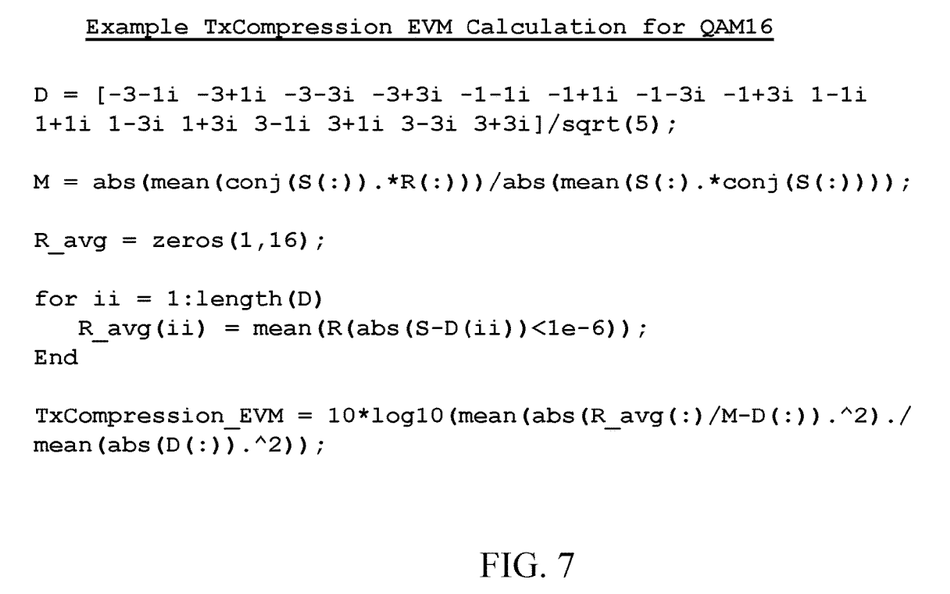
FIG. 7 illustrates an example equation for calculating a compressed EVM metric for QAM16, in accordance with certain aspects of the present disclosure.

FIG. 7 illustrates an example equation that may be used to calculate a Tx Compression EVM Metric for QAM16, in accordance with aspects of the present disclosure. As illustrated, constellation centroids are estimated for the 16 constellation points, based on the received signals. EVM is then calculated between these centers to the constellation dictionary. The resultant metric may give accurate Tx Compression EVM even with very low SNR, due to relative immunity to interfering signals (due to proximity of transmit and receive antennas). A station may use the resulting Tx Compression EVM metric to make adjustments when transmitting to improve the quality of the transmitted signal, for example, by causing transmitted constellation points to be closer to their ideal positions in the I-Q plane.

It is understood that the specific order or hierarchy of steps in the processes disclosed above is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

Moreover, the term "or" is intended to mean an inclusive "or" rather than an exclusive "or." That is, unless specified otherwise or clear from the context, the phrase, for example, "X employs A or B" is intended to mean any of the natural inclusive permutations. That is, for example the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

A phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

In some cases, rather than actually transmitting a frame, a device may have an interface to output a frame for transmission. For example, a processor may output a frame, via a bus interface, to an RF front end for transmission. Similarly, rather than actually receiving a frame, a device may have an interface to obtain a frame received from another device. For example, a processor may obtain (or receive) a frame, via a bus interface, from an RF front end for transmission.

The various operations of methods described above may be performed by any suitable means capable of performing the corresponding functions. The means may include various hardware and/or software component(s) and/or module (s), including, but not limited to a circuit, an application specific integrated circuit (ASIC), or processor.

Figure 5A:
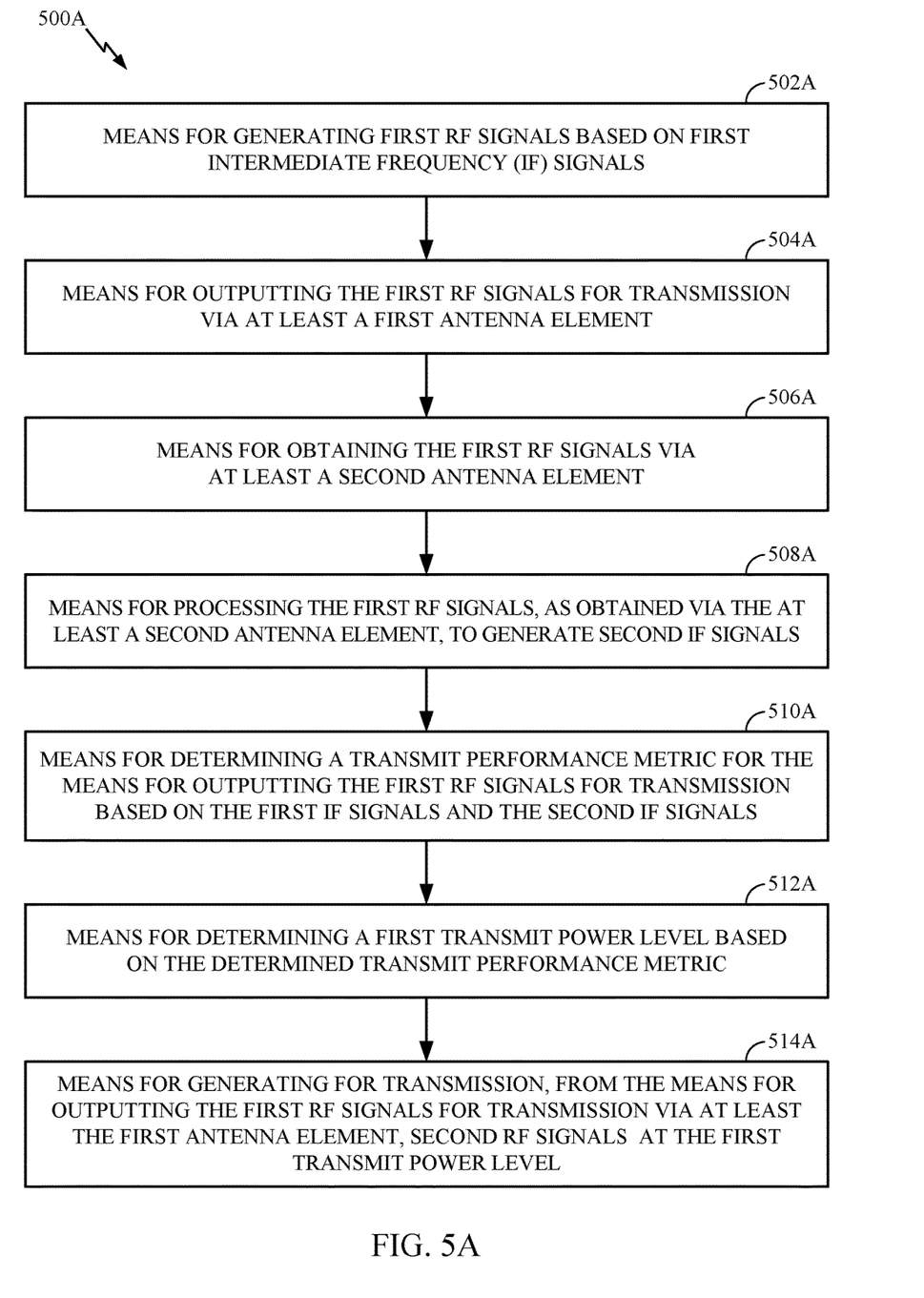
FIG. 5A illustrates example means capable of performing the operations shown in FIG. 5.

Generally, where there are operations illustrated in figures, those operations may have corresponding counterpart means-plus-function components with similar numbering. For example, operations 500 illustrated in FIG. 5 correspond to means 500A illustrated in FIG. 5A, respectively.

For example, means for receiving and means for obtaining may be a receive portion of an RF chip (e.g., the receive portion of RF chip 422) and/or an antenna(s) 432 of the RF system 400 illustrated in FIG. 4. Means for transmitting and means for outputting may be a transmit portion of an RF chip (e.g., the transmit portion of RF chip 424) and/or an antenna(s) 434 of the RF system 400 illustrated in FIG. 4.

Means for estimating, means for selecting, means for performing, means for generating, means for including, means for normalizing, means for adjusting, means for determining, and means for providing may comprise a processing system, which may include one or more processors, such as a RX data processor, a TX data processor, and/or a controller of a station (STA) or a TX data processor, a RX data processor, and/or a controller of the access point.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a station (STA) 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-Ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media. Thus, certain aspects may comprise a computer-readable medium having instructions stored (and/or encoded) thereon, the instructions being executable by one or more processors to perform the operations described herein.

Further, it should be appreciated that modules and/or other appropriate means for performing the methods and techniques described herein can be downloaded and/or otherwise obtained by a STA and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a STA and/or base station can obtain the various methods upon coupling or providing the storage means to the device. Moreover, any other suitable technique for providing the methods and techniques described herein to a device can be utilized.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An apparatus for wireless communications, comprising:
an interface configured to:
provide first intermediate frequency (IF) signals to a radio frequency (RF) module for use in generating first RF signals for transmission via an antenna element, and
obtain second IF signals generated based on the first RF signals; and
a processing system configured to:
determine a transmit performance metric for the RF module based on the first IF signals and the second IF signals,
determine a first transmit power level based on the determined transmit performance metric, and cause the RF module to generate second RF signals for transmission via the antenna element at the first transmit power level.

2. The apparatus of claim 1, wherein the transmit performance metric comprises a transmit error vector magnitude (EVM) metric.

3. The apparatus of claim 1, wherein the processing system is configured to cause the RF module to generate second RF signals for transmission via the antenna element at the first transmit power level by changing a configuration of the RF module.

4. The apparatus of claim 1, wherein:
the interface is further configured to provide third IF signals to the RF module for use in generating third RF signals and obtain fourth IF signals generated based on the third RF signals; and
the transmit performance metric is determined also based on the fourth IF signals.

5. The apparatus of claim 1, wherein the processing system is configured to calibrate a power amplifier of the RF module based on the transmit performance metric.

6. A method for wireless communications, comprising:
providing first intermediate frequency (IF) signals to a radio frequency (RF) module for use in generating first RF signals for transmission via an antenna element;
obtaining second IF signals generated based on the first RF signals;
determining a transmit performance metric for the RF module based on the first IF signals and the second IF signals;
determining a first transmit power level based on the determined transmit performance metric; and
causing the RF module to generate second RF signals at the first transmit power level for transmission via the antenna element.

7. The method of claim 6, wherein the transmit performance metric comprises a transmit error vector magnitude (EVM) metric.

8. The method of claim 6, wherein causing the RF module to generate second RF signals at the first transmit power level comprises changing a configuration of the RF module.

9. The method of claim 6, further comprising:
providing third RF signals to the RF module for use in generating third RF signals; and
obtaining fourth IF signals generated based on the third RF signals, as obtained via the second antenna element;
wherein the transmit performance metric is determined also based on the fourth IF signals.

10. The method of claim 6, further comprising:
calibrating a power amplifier of the RF module based on the transmit performance metric.

11. An wireless station, comprising:
first and second antenna elements;
a first radio frequency (RF) module configured to:
generate first RF signals based on first intermediate frequency (IF) signals, and
transmit the first RF signals via the first antenna element;
a second RF module configured to:
receive the first RF signals via the second antenna element, and
generate second IF signals based on the first RF signals as received via the second antenna element; and
a baseband module configured to:
determine a transmit performance metric for the first RF module based on the first IF signals and the second IF signals,
determine a first transmit power level based on the determined transmit performance metric, and
cause the first RF module to generate second RF signals for transmission via the first antenna element at the first transmit power level.

12. The wireless station of claim 11, further comprising a plurality of amplifier chains, wherein:
the second RF module is configured to select one of the plurality of amplifier chains, based on lowest output power; and
the selected amplifier chain is configured to receive the first RF signals.

13. The wireless station of claim 11, further comprising an attenuator, wherein:
the second RF module is configured to
attenuate, with the attenuator, the first RF signals as received via the second antenna element, and
receive one or more other RF signals via the second antenna element independent of the attenuator.

14. The wireless station of claim 11, further comprising a low noise amplifier (LNA), wherein:
the second RF module is configured to process the first RF signals as received via the second antenna element independent of the LNA; and the LNA is configured to amplify one or more other RF signals received via the second antenna element.

* * * * *